(12) United States Patent
Silva-Martinez et al.

(10) Patent No.: US 10,389,316 B1
(45) Date of Patent: Aug. 20, 2019

(54) APPARATUS AND METHODS FOR POWER EFFICIENT CMOS AND BICMOS TRANSMITTERS SUITABLE FOR WIRELESS APPLICATIONS

(71) Applicant: Vidatronic, Inc., College Station, TX (US)

(72) Inventors: Jose Silva-Martinez, College Station, TX (US); Moises Robinson, College Station, TX (US); Mauricio Zavaleta, Austin, TX (US); John Tabler, College Station, TX (US); He Hu, Bryan, TX (US)

(73) Assignee: Vidatronic, Inc., College Station, TX (US)

( * ) Notice: Subject to any disclaimer, the term of this patent is extended or adjusted under 35 U.S.C. 154(b) by 0 days.

(21) Appl. No.: 16/279,190

(22) Filed: Feb. 19, 2019

Related U.S. Application Data

(60) Provisional application No. 62/632,382, filed on Feb. 19, 2018.

(51) Int. Cl.
| H03F 3/68 | (2006.01) |
| H04B 1/04 | (2006.01) |
| H03F 3/21 | (2006.01) |
| H03F 3/24 | (2006.01) |
| H03F 1/02 | (2006.01) |

(52) U.S. Cl.
CPC ........... *H03F 3/245* (2013.01); *H03F 1/0288* (2013.01); *H04B 1/0458* (2013.01); *H03F 2200/129* (2013.01); *H03F 2200/387* (2013.01); *H03F 2200/414* (2013.01); *H03F 2200/451* (2013.01); *H03F 2203/21139* (2013.01); *H03F 2203/21163* (2013.01)

(58) Field of Classification Search
CPC .............. H04B 1/04; H04B 2001/0408; H04B 2001/0416; H03F 1/02; H03F 1/02277; H03F 3/21; H03F 3/220027; H03F 2200/405; H03F 2200/465; H03F 2200/541
See application file for complete search history.

(56) References Cited

U.S. PATENT DOCUMENTS

2009/0091384 A1* 4/2009 Sorrells ................. H03F 1/0272
330/207 R
2011/0260797 A1* 10/2011 Lee ......................... H03F 3/211
330/295

(Continued)

*Primary Examiner* — Blane J Jackson
(74) *Attorney, Agent, or Firm* — Liang Legal Group, PLLC

(57) ABSTRACT

A silicon based (e.g., SiGe, CMOS, or BiCMOS) transmitter includes an algorithm that strategically segment and pre-distort the input signal according to its power; a reconfigurable power amplifier (PA) having a plurality of PA sections, wherein the plurality of PA sections comprise discrete weighted transistor arrays that are digitally turned OFF or ON according to a magnitude of an input signal; an impedance matching network equipped with a common-mode feedback (CMFB) mechanism configured to reduce common-mode glitches at an output of the PA due to ON/OFF manipulations of the PA segments; and a 1:N transformer, which comprises a capacitive matching engine and a power detector, disposed between the impedance matching network and the reconfigurable linear PA.

7 Claims, 9 Drawing Sheets

(56) References Cited

U.S. PATENT DOCUMENTS

| | | | | |
|---|---|---|---|---|
| 2011/0298545 A1* | 12/2011 | Morimoto | ............ | H03F 1/0216 330/296 |
| 2012/0302186 A1* | 11/2012 | Jones | ................... | H03F 1/0227 455/127.1 |
| 2014/0184328 A1* | 7/2014 | Binet | ................... | H03F 3/2171 330/251 |

* cited by examiner

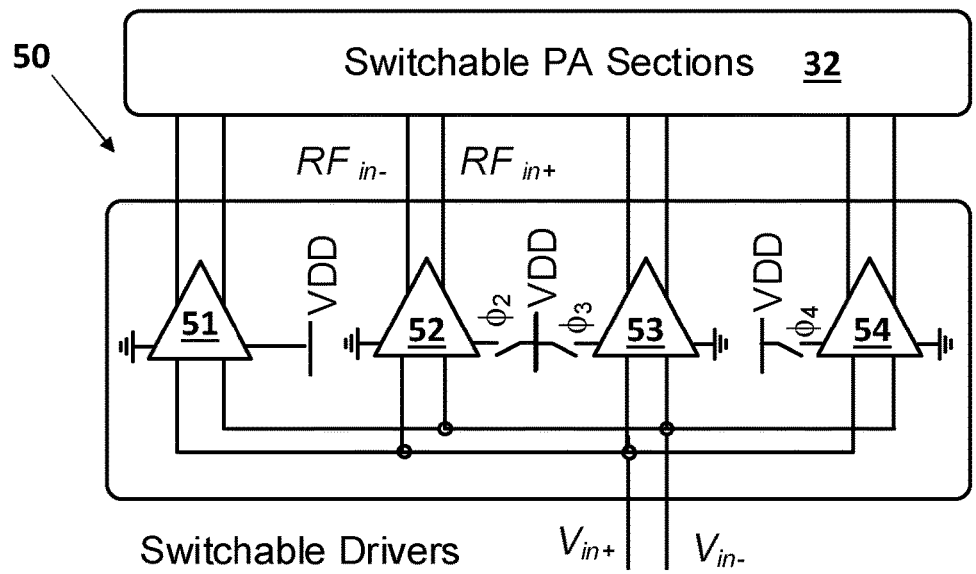
FIG. 5
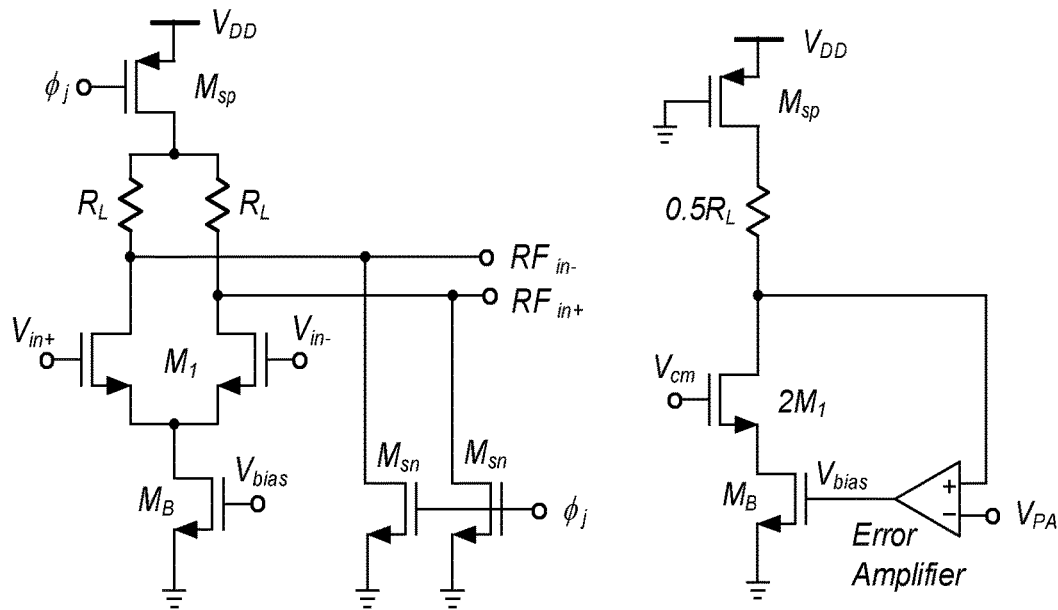
FIG. 6A          FIG. 6B

APPARATUS AND METHODS FOR POWER EFFICIENT CMOS AND BICMOS TRANSMITTERS SUITABLE FOR WIRELESS APPLICATIONS

CROSS REFERENCE TO RELATED APPLICATIONS

This claims the priority of Provisional Application No. 62/632,382, filed on Feb. 19, 2018, the disclosure of which is incorporated by reference in its entirety.

STATEMENT REGARDING FEDERALLY SPONSORED RESEARCH OR DEVELOPMENT

This invention was made with government support under Federal Agency Identification Number (FAIN) 1747138 awarded by National Science Foundation. The government has certain rights in the invention.

FIELD OF THE INVENTION

This invention relates to apparatus and methods for CMOS transmitters with improved power efficiency.

BACKGROUND OF THE INVENTION

Recent developments in mobile computing and wireless internet have led to an increasing demand for portable computers and smart phones equipped with wireless local area network (WLAN) operating with multi-standard capabilities. More standards and applications will be incorporated in the near future because minimum feature sized transistors in VLSI technology allow more devices on a single chip with massive digital signal processing and memory capabilities. The recently released 2×2 IEEE 802.11ac Wi-Fi technology offers superior performance, while reducing download times and increasing web browsing speed. This technology uses two antennas, but it supports antenna sharing between different standards. The downside is that multiple-input, multiple-output (MIMO) technologies require multiple antennas and multiple transceivers.

Power efficient amplifiers for legacy services and emerging technologies are of primary relevance (S. C. Cripps, "*RF Power Amplifiers for Wireless Communications*," Artech House Inc., Norwood Mass., 1999; S. Egolf, "*Intelligent Power Management: A Method to Improve 2G/3G Handset Talk Time*," Microwave Journal, pp. 94-100, July 2007; T. Gillenwater, "*Evolution of the Smartphone*," Microwave Journal, Vol. 2, February 2017.). Erickson and Heidt (U.S. Pat. No. 4,547,746) suggested that correlating the power supply with output signal power can maintain the power-added efficiency (PAE) by keeping it constant and close to peak value. Power efficient nonlinear amplifiers, such as those found in class AB and B, have been combined to achieve better PAE figures (U.S. Pat. No. 5,175,871).

The envelope tracking technique (class G amplifier) shown in FIG. 1 is useful for improving voltage efficiency. In this case, the power supply is adjusted to the voltage needed for processing the signal. With the evolution of wireless technologies and the demand for multi-standard applications, the aforementioned two techniques were combined by Faulkner and Briffa, as described in U.S. Pat. No. 5,420,536. This technique offers several benefits when large supply voltages are used. However, limited benefits are obtained when low-voltage deep submicron CMOS technologies are employed due to drain-source voltage limitation restrictions. Optimized architectures following this approach are commonly found in recent realizations (U.S. Pat. Nos. 7,042,283, 5,712,593, 5,880,633, 5,880,633, and M. Hassan et al., "*High Efficiency Envelope Tracking Power Amplifier with Very Low Quiescent Power for 20 MHz LTE*," IEEE Proc. of the Radio Frequency Integrated Circuits Symposium, June 2011).

Class H architectures employing multiple power supplies to improve power amplifier (PA) power efficiency have also been developed (J. S. Walling et al., "*A Class-G Supply Modulator and Class-E PA in 130 nm CMOS*," IEEE J. Solid-State Circuits, pp. 2339-2347, September 2009; S.-M. Yoo, et. al., "*A class-G dual-supply switched-capacitor power amplifier in 65 nm CMOS*," in Procc. IEEE RF-IC, June 2012, pp. 233-236; U.S. Pat. No. 8,829,993). The overhead could be excessive, preventing its adoption in massive low-cost consumer electronic products. In other designs, the PA is segmented and coupled to the primary of the transformer, and then the effective load impedance is modulated to efficiently deliver power to the antenna (G. Liu et al., "*A 1.2V, 2.4 GHz Fully Integrated Linear CMOS Power Amplifier with Efficiency Enhancement*," Proc. IEEE 2006 Custom Integrated Circuits Conference, pp. 141-144, 2006; I. Aoki et al., "*A Fully-Integrated Quad-Band GSM/GPRS CMOS Power Amplifier*," IEEE J. Solid-State Circuits, pp. 2747-2758, December 2008). A different implementation uses a segmented DAC-driven polar PA to implement the envelope tracking technique in current mode (P. T. M. Zeijl and M. Collados, "*A Digital Envelope Modulator for a WLAN OFDM Polar Transmitter in 90 nm CMOS*," IEEE J. Solid-State Circuits, pp. 2204-2211, 2007; J. Xiao et al., "*A 13-Bit 9GS/s RF DAC-Based Broadband Transmitter in 28 nm CMOS*," Procc. of the IEEE VLSI, pp. C262-C263, September 2013), resulting in a solution that competes with the voltage envelope tracking approach, the main concept of which is shown in FIG. 2. These techniques are especially relevant for polar PAs. The phase is up-converted and fed into the switchable bank of PA sections. The magnitude is used to control the segments of the PA, and thereby modulates the current delivered to the antenna through the impedance matching network. The impedance matching network is used to minimize signal swing within the limits allowed by the CMOS technology (H. Qian et al., "*A 35 dBm Output Power and 38 dB Linear Gain PA with 44.9% Peak PAE at 1.9 GHz in 40 nm CMOS*," IEEE Journal of Solid-State Circuits, pp. 587-597, March 2016). The CMOS PA is particularly relevant to emerging technologies because it can take advantage of the powerful signal processors available in this technology (Y. Yoon et al., "*A dual-mode CMOS RF power amplifier with integrated tunable matching network*," IEEE Transactions on Microwave Theory and Techniques, vol. 60, no. 1, pp. 77-88; A. Afsahi and L. Larson, "*Monolithic power-combining techniques for watt-level 2.4-GHz CMOS power amplifiers for WLAN applications*," Transactions on Microwave Theory and Techniques, IEEE Transactions on, vol. 61, no. 3, pp. 1247-1260; A. Niknejad et al., "*Design of CMOS power amplifiers*," IEEE Transactions on Microwave Theory and Techniques, vol. 60, no. 6, pp. 1784-1796; L. Ye, J Chen et al., "*A digitally modulated 2.4 GHz WLAN transmitter with integrated phase path and dynamic load modulation in 65 nm CMOS*," in Solid-State Circuits Conference Digest of Technical Papers (ISSCC), 2013 IEEE International, February 2013, pp. 330-331).

Deep-submicron CMOS technology scaling progress has adverse effects for analog processors, such as lower transistor output impedance, limited voltage headroom, higher flicker noise, and higher hot carrier effects. In addition, process, voltage, and temperature (PVT) variations produce system performance deviations from the desired target. A major limitation in CMOS technology that prevented its adoption in medium and high-power transmitters is its limited efficiency. Therefore, there is still a need for more power efficient CMOS transmitters suitable for wireless applications.

SUMMARY OF THE INVENTION

Embodiments of the invention relate to efficient silicon-based (e.g., SiGe, CMOS, or BiCMOS) transmitters that are suitable for wireless applications. In particular, these silicon-based (e.g., SiGe, CMOS, or BiCMOS) transmitters are suitable for medium and high-power applications.

One aspect of the invention relates to silicon-based (e.g., CMOS and BiCMOS) transmitters. For clarity, the inventions will be illustrated using the CMOS technology. However, one skilled in the art would appreciate that this invention is equally efficient if exported to other technologies, such as SiGe and BiCMOS. A CMOS transmitter in accordance with one embodiment of the invention includes a digital algorithm that pre-processes an input signal and a segmented linear power amplifier (PA) having a plurality of PA sections, wherein the plurality of PA sections comprise discrete weighted transistor arrays that are digitally turned OFF or ON according to a magnitude of an input signal; a set of switchable radio frequency drivers, which control PA sections that are configured to improve transmitter power efficiency; an impedance matching network equipped with a common-mode feedback (CMFB) mechanism configured to reduce common-mode glitches at an output of the PA due to ON/OFF manipulations of the PA sections; and a 1:N transformer, which comprises a capacitive matching engine and a power detector, disposed between the impedance matching network and the reconfigurable linear PA.

Other aspects of the invention would become apparent with the following detailed description and the attached drawings.

BRIEF DESCRIPTION OF THE DRAWINGS

FIG. 5 shows a block diagram of a switchable PA drivers used to drive PA sections in accordance with one embodiment of the invention, in which the first driver is permanently On while others are turned On or Off according to the control phases $\phi_2$ and $\phi_3$, and $\phi_4$.

FIG. 6A shows a transistor level realization of a switchable driver. FIG. 6B shows a tail current voltage generator.

DETAILED DESCRIPTION

Embodiments of the invention relate to broadband power-efficient CMOS transmitters suitable for RF communication systems. Embodiments of the invention can achieve high power with added efficiency, high-linearity RF transmitter architectures in mainstream CMOS technologies. Embodiments of the invention use a digitally-assisted, segmented power amplifier (PA) architecture that achieves superior power savings mainly at moderate and deep back-off power levels. Its specialized leverage is based on the digital control of its PA sections such that the current consumption is correlated with the power delivered to the antenna, while the power gain is accurately controlled with a simple yet efficient digital algorithm. In accordance with some embodiments of the invention, the use of a 1:N transformer enables the use of this architecture when low power supply voltages are used, making it more power efficient when delivering high power.

In accordance with embodiments of this invention, an input signal is segmented and pre-processed in the digital domain, and then the processed signal is passed to a digitally-assisted linear PA architecture that is coupled to the antenna. A 1:N turns ratio transformer may be optionally used to deliver high power and to achieve unique power savings at moderate and deep back-off power levels. Peak power added efficiency in accordance with embodiments of this invention is competitive with class AB designs when delivering maximum power and surpasses them at back-off power levels.

Figure 1:
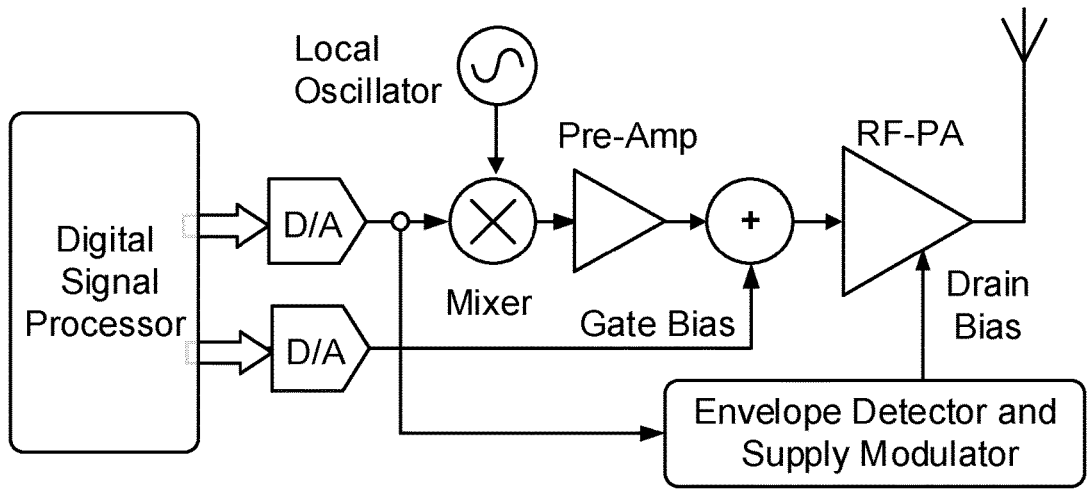
FIG. 1 shows a block diagram of a conventional RF transmitter employing gate bias and drain bias techniques.
Figure 2:
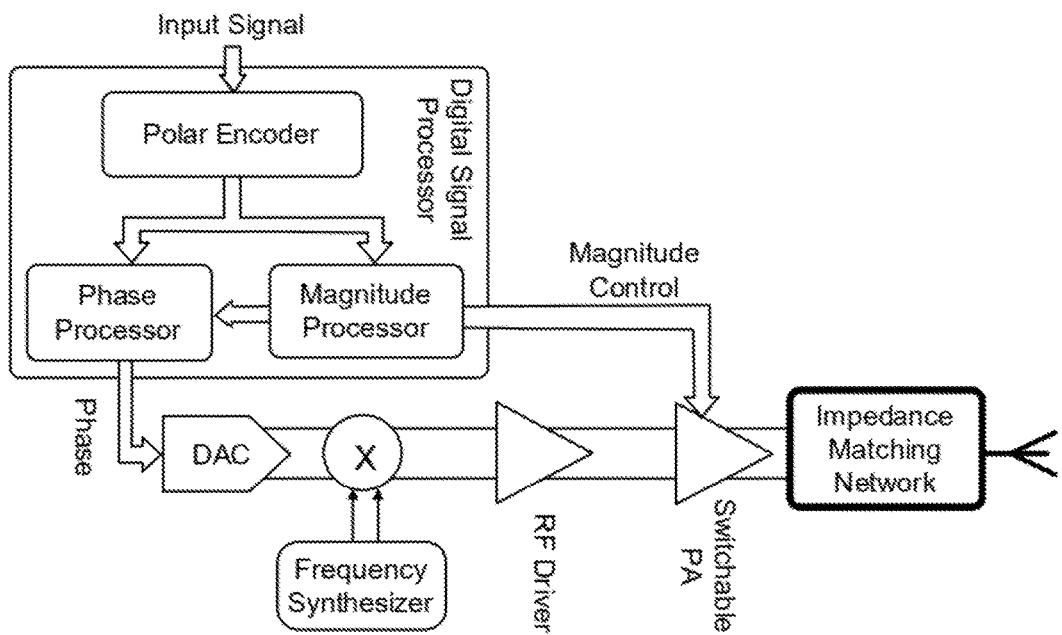
FIG. 2 shows a prior art polar receiver employing a switchable power amplifier.
Figure 3:
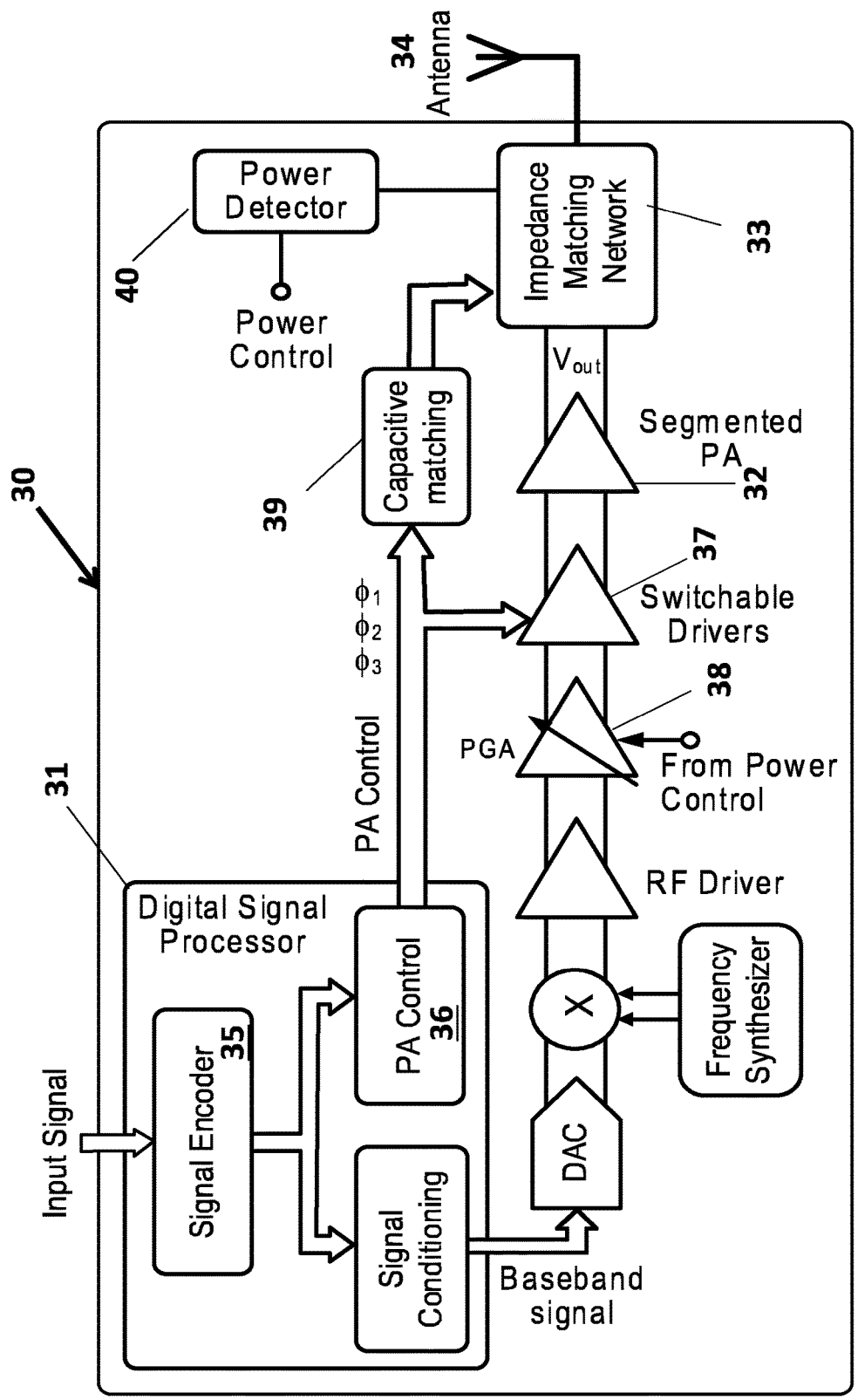
FIG. 3 shows a block diagram of a CMOS transmitter according to one embodiment of the invention, in which the digital input signal is segmented and amplified according to its input amplitude, and PA control signals are generated to drive the PA sections.

FIG. 3 shows an example of a CMOS transmitter in accordance with one embodiment of the invention. As shown in FIG. 3, a CMOS transmitter 30 of the invention may comprise a digital signal processing platform 31, a digitally-assisted linear PA architecture 32, an impedance matching network 33 (which may include an optional 1:N turns ratio transformer), and an antenna 34. One skilled in the art would appreciate that other modifications or variations of such implementations are possible without departing from the scope of the invention.

In the example of FIG. 3, a software-based controller (signal encoder) 35 measures an input signal power in the digital domain employing a simple algorithm and strategically (i.e., when it is necessary or desirable) amplifies the weak signals. This operation is very accurate because the gain factor in the digital domain is very accurate. The gain factor is recorded in digital format and used to control the PA gain by turning ON or OFF some of its sections. The PA 32 is split into a number of segments (sections). If the input signal is amplified in the digital signal processor 35, an inverse function is implemented in the segmented PA 32. The inverse operation is to reduce the PA output current, and this reduction is accurate because it is implemented through the manipulation of PA segments 32 that are based on replicas of a core unit. For example, if the signal power is found to be at a selected level (e.g., 6 dB) below the maximum power, the signal is amplified by an appropriate factor (e.g., a factor of two for a signal of 6 dB) in the digital domain.

To maintain the overall power gain constant and conserve energy, some (e.g., 50%) of the PA segments 32 may be turned off during operations. This operation automatically optimizes the architecture for best possible current efficiency and cuts the power consumption (e.g., by 50%). For smaller signals, more sections of the PA 32 may be disabled. As a result, record power savings may be achieved. The strategic digital amplification factor is accompanied by a proper reduction of active PA sections 32, leading to significant power savings. This architecture employs multiple switchable replicas of an optimized core cell. The PA segments are controlled through a set of switchable PA drivers. The resulting PA output current is then delivered to the antenna through an impedance matching network. The impedance matching network operates as an impedance scaler that efficiently transfer PA power to the antenna. In an embodiment with an optional 1:N transformer, the apparent impedance of the antenna reflected at the PA output is reduced by a factor equal to the square of the turns ratio. Indeed, the equations for an ideal 1:N transformer show that transformer parameters at the primary (input) and secondary (output) are related as follows:

$$v_o = N v_i \quad (1)$$

$$i_i = N i_o$$

$$\frac{v_i}{i_i} = \left(\frac{1}{N^2}\right)\frac{v_o}{i_o}$$

In accordance with embodiments of this invention, the PA sections deliver current ($i_i$). Therefore, the apparent impedance due to the antenna's impedance is of primary relevance because it determines the signal swing at the PA output terminals. Previous studies suggest that radio frequency transformers can be efficiently designed in CMOS technologies (A. Hajimiri, "*Next-Generation CMOS RF Power Amplifiers*," IEEE Microwave Magazine, Vol. 12, pp. 38-45, 2011; Y. H. Chee et al., "*A digitally assisted CMOS WiFi 802.11ac/11ax front-end module achieving 12% PA efficiency at 20 dBm output power with 160 MHz 256-QAM OFDM signal,*" 2017 IEEE International Solid-State Circuits Conference, pp. 292-293; E. Kaymaksut and P. Reynaert, "*Transformer-based uneven Doherty power amplifier in 90 nm CMOS for WLAN Applications*," IEEE Journal of Solid-State Circuits, vol. 47, no. 7, pp. 1659-1671; A. M. Niknejad, "*Inductors and Transformers: Enabling the Gigahertz Silicon IC Revolution*," Solid-State Circuits Magazine, pp. 30-32; U.S. Pat. Nos. 6,856,199, 7,157,965).

The PA's output impedance is not constant when its segments are manipulated by the PA control code. The optimal condition for power transfer requires the optimization of the impedance in the primary. An RF transmitter of the invention includes an impedance matching network 33. In accordance with embodiments of this invention, such optimal condition for power transfer may be achieved through the clever adjustment of a tuning knob (a capacitive bank 39), driven by the PA control code. The bank of capacitors are designed to compensate for capacitive variations at $V_{out}$ due to switching of the PA sections.

FIG. 3 shows an embodiment, in which the impedance matching network 33 is equipped with a common-mode feedback (CMFB) mechanism. The CMFB mechanism reduces the common-mode glitches that may appear at the PA output due to the ON/OFF manipulations of the PA segments 32, which modulate RF power but also produce DC current steps. The transmitter includes a power detector 40 that samples the power level at the PA output. This power level information is required to accurately adjust transmitter output power through an RF programmable gain amplifier (PGA) 38.

Description of Signal Encoder

A CMOS RF transmitter according to embodiments of the invention employs a segmented PA (shown as 32 in FIG. 3 and will be discussed later) driven by an algorithm using a digital gain equalization methodology that optimizes its current efficiency. The PA is segmented into discrete weighted transistor arrays that are digitally turned OFF or ON according to the magnitude of the input signal.

Figure 4:
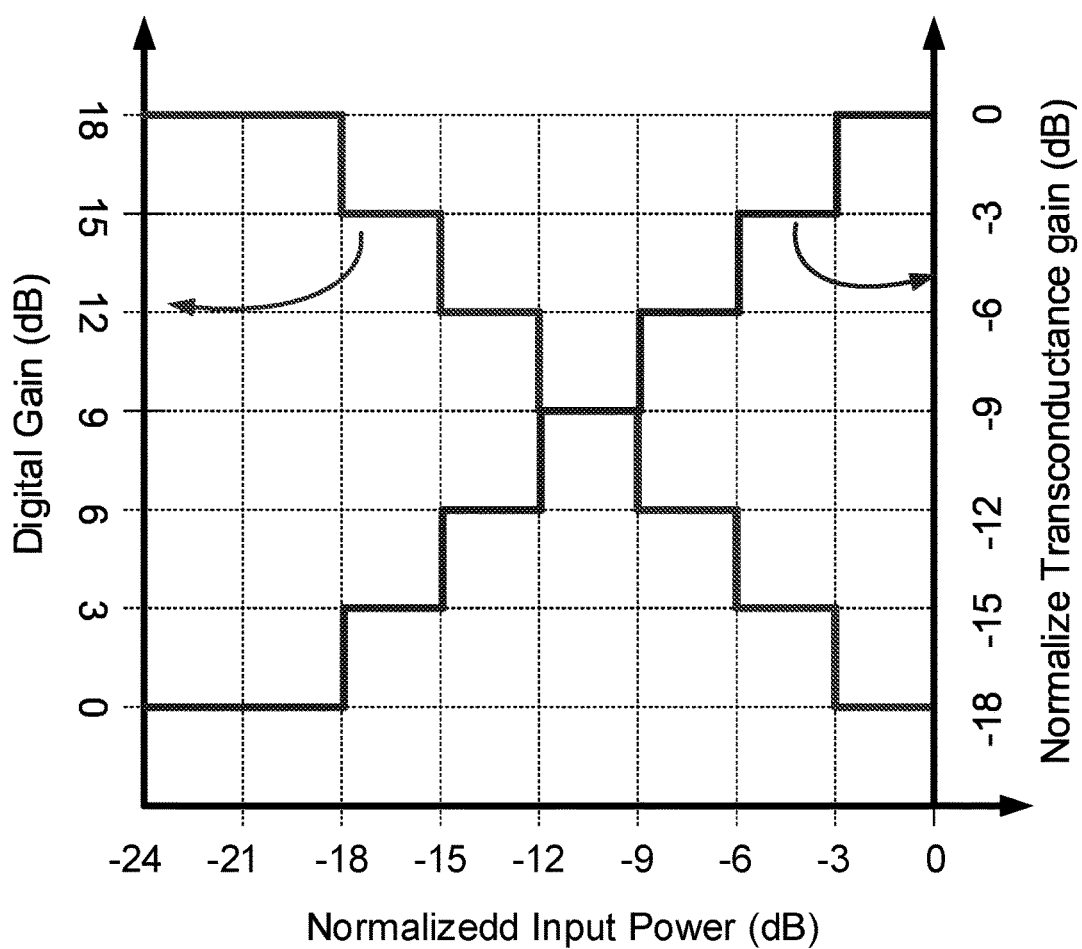
FIG. 4 shows a digital segmentation gain (left axis) and normalized analog PA transconductance gain (right axis) as a function of the input signal's power in accordance with one embodiment of the invention. The input power is normalized with respect to maximum PA output power.

FIG. 4 shows the digital gain and PA transconductance gain distributions for an example with seven segments. One skilled in the art would appreciate that the seven segments are for illustration only and any appropriate numbers of segments may be used with embodiments of the invention. In this example, the input signal is classified at every 3 dB of back-off power and a magnitude control code is generated for each segment. The peak value of the segmented signal is amplified in the digital domain by the corresponding gain to reach the transmitter peak signal. The magnitude control codes generated when segmenting the input signal in the digital domain are used to control the PA sections. To maintain the transmitter power gain invariant, if the signal is digitally amplified by a factor X, then 1/X of PA segments are activated, leading to significant power savings in both drivers and the PA. DC current savings over 87.5% are obtained when input signal power is under −18 dB back-off power levels because digital gain is set at 8, while 87.5% of the drivers and PA sections are turned off. Digital gain is precise, low power, and noiseless. The transconductance gain of the segmented PA is accurate because it is based on activation and deactivation of a discrete number of PA sections.

Table 1 shows more details on the selection of digital gain and control of PA sections for an example having seven segments (with 3 dB steps). The PA power efficiency shows superior performance at large back-off power levels, because the current consumption is correlated with the transmitted signal power. The invention is very effective when processing signals with large peak to average ratio. An important feature in embodiments of the invention is that signal amplification in digital domain does not increase the power consumption but enables the use of PA segmentation. Turning OFF PA segments leads to significant power savings. The segment distributions shown in Table 1 and FIG. 4 are based on 3 dB power segments. However, these are examples for illustration only. One skilled in the art would appreciate that other gain distributions can be equally efficient and can be implemented easily.

TABLE 1

Digital and PA gain distribution strategy used for an exemplary case of 3 dB segmentation; other PA segmentation levels are possible.

| Transmit Back off Power | Digital Gain | Number of PA sections "on" | PA Power Saving |
|---|---|---|---|
| 0 to −3 dB | 0 dB | 100 % | 0 % |
| −3 to −6 dB | 3 dB | 70.8 % | 29.2 % |
| −6 to −9 dB | 6 dB | 50 % | 50 % |
| −9 to −12 dB | 9 dB | 35.5 % | 64.5 % |
| −12 to −15 dB | 12 dB | 25 % | 75 % |
| −15 to −18 dB | 15 dB | 17.8 % | 82.2 % |
| < −18 dB | 18 dB | 12.5 % | 87.5 % |

Description of the Switchable Driver Block

As described above, a PA in a CMOS RF transmitter of the invention is segmented into multiple sections, each of which is selectable by PA control signals (control phases). The selection (or switching) of the PA sections may be implemented with any suitable scheme. FIG. 5 shows an example of a switchable driver block 50 in accordance with one embodiment of the invention. This block realizes three functions: i) to amplify the signal delivered by the PGA (shown as 38 in FIG. 3), ii) to turn On or Off the PA sections 32 according to the control phases, and iii) to define the proper bias voltage for the PA sections when enabled. For this purpose, the On-Off switchable drivers are DC coupled to the PA, which makes the transmitter function. When operating in the OFF region, both the switchable driver block 50 and PA sections 32 do not dissipate power. In the PA, one of these sections is always ON to manage the weak signals, while the remaining sections are controlled by switchable drivers 52,53,54, which are driven through the control signals $\phi_2$, $\phi_3$, and $\phi_4$. One skilled in the art would appreciate that this example is for illustration only and other variations and modifications are possible without departing from the scope of the invention. The switchable drivers 52,53,54 generate a zero DC output voltage while operating in the OFF mode but provide the DC level required by the PA sections while operating in the ON mode. In this manner, the bias conditions for PA sections may be controlled through the switchable drivers 52,53,54.

Any suitable implementation for the switchable drivers (e.g., 52,53,54) may be used with embodiments of the invention. FIG. 6A shows an exemplary schematic of a switchable driver in accordance with one embodiment of the invention. In this example, the driver consists of a differential pair with resistive loads $R_L$, a P-type switch $M_{sp}$ controlled by a magnitude control code $\phi_j$, and two N-type switches $M_{sn}$, which are used to ground the driver outputs when the switchable driver is disabled. The bias voltage, $V_{bias}$, may be generated through a replica circuit shown in FIG. 6B to ensure that the DC voltage generated at the driver output is the one required by the PA sections. The reference voltage at the error amplifier input $V_{PA}$ is the gate-source voltage generated from the replica of a PA finger biased with the desired drain current; this is the DC voltage that is applied to the gate of PA sections when activated. The high loop gain generates a bias current that forces the driver output to be equal to $V_{PA}$. The bias voltage $V_{bias}$, generated by the loop, is used to bias all driver sections. Layout matching and other practical design considerations make the biasing circuit quite robust. Matching of components and drain voltage in transistors MB is needed to generate a bias current that produces the correct bias voltage for all PA sections. Equally important is the matching of resistors $R_L$ and transistors $M_{sp}$.

Description of the Segmented PA

Figure 7:
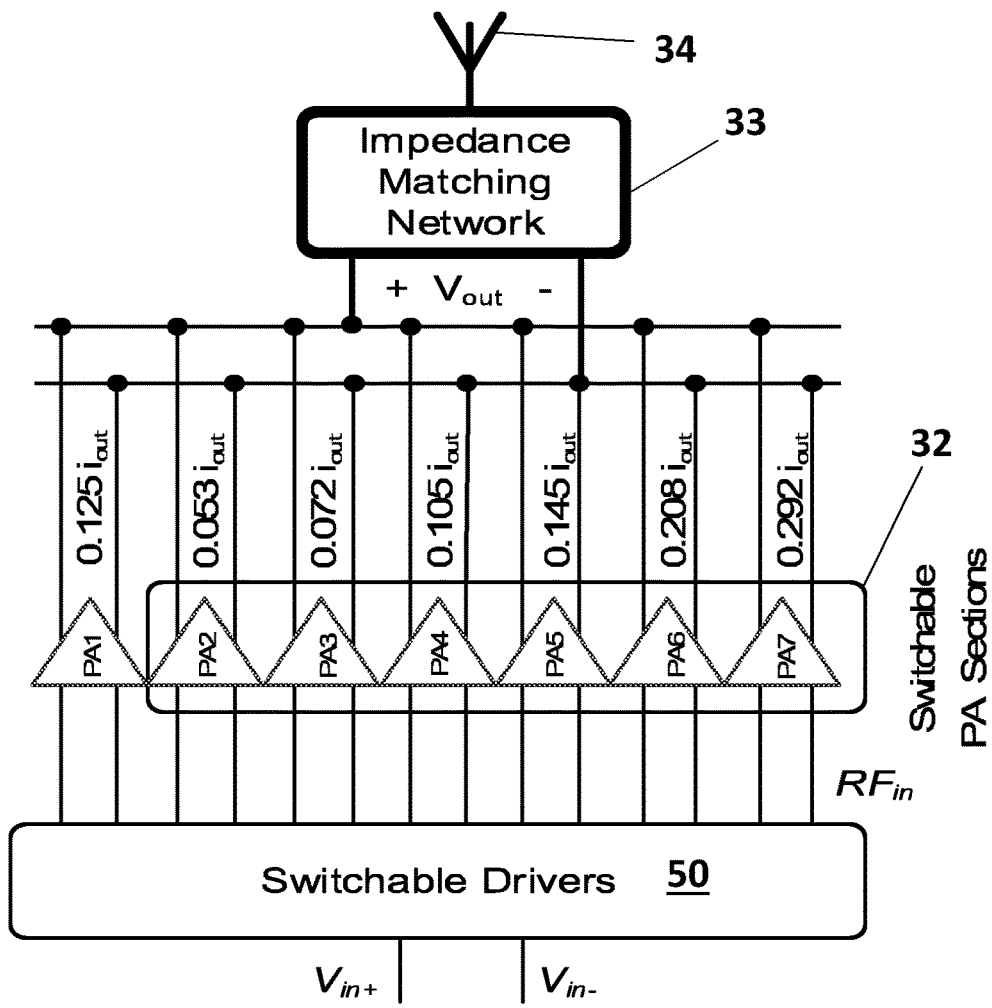
FIG. 7 shows a block diagram showing the PA sections for an example with 3 dB segmentations, in which PA1 is non-switchable while PA2-PA7 are switchable, in accordance with one embodiment of the invention.

A PA of the invention is segmented into multiple sections. Several approaches are possible to design the multiple sections. For example, the multiple sections may be designed with identical or non-identical elements. FIG. 7 shows an example of a weighted array of switchable PA sections. Each section consists of a number of fingers that are set according to the output power demanded by the standard. In this example, the weighted array of PA sections matches the gain values given in Table 1, and the output power is segmented in 3 dB slots. In this example, seven (7) PA sections are shown, among which the first one (PA1) is not switchable. One skilled in the art would appreciate that this example is for illustration only and other variations and modifications are possible without departing from the scope of the invention. For example, more or fewer than 7 PA sections may be used depending on the application. In addition, while this example has a 3 dB difference between PA sections, other equal differences or non-equal differences may also be employed.

In the example of FIG. 7, if all switchable PA sections 32 are off, only 12.5% of the PA sections remain enabled. This mode of operation corresponds to −18 dB transconductance gain, as compared with the peak value of PA transconductance gain. If PA2 section is enabled, the overall transconductance increases up to −15 dB transconductance gain relative to the peak value of PA transconductance gain. Turning ON both PA2 and PA3 segments leads to −12 dB transconductance gain relative to the PA peak transconductance value. Turning ON PA2-PA4 segments can lead to a PA gain of −9 dB relative to the PA peak value. Turning ON the groups PA2-PA5, PA2-PA6, and PA2-PA7 lead to −6 dB, −3 dB and 0 dB PA transconductance gains, respectively. The PA output current flows through the impedance matching network 33 before reaching the antenna 34.

Figure 8:
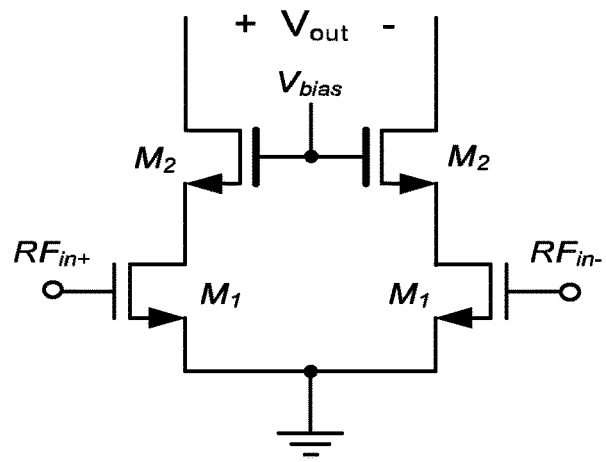
FIG. 8 shows a transistor level realization of a PA segment, in which M1 are realized using fast transistors and M2 are realized using high voltage devices, in accordance with one embodiment of the invention.

FIG. 8 shows a schematic of one example of a PA's unit finger in accordance with one embodiment of the invention. The RF inputs (transistors M1) are directly coupled to the PA drivers. The drain currents of transistors M1 are coupled to the impedance matching network 33 through the cascode transistors M2. Transistors M2 may be implemented using high voltage devices because the signal swings at its drain can be large, especially for high-power applications.

Description of the Impedance Matching Network

Figure 9:
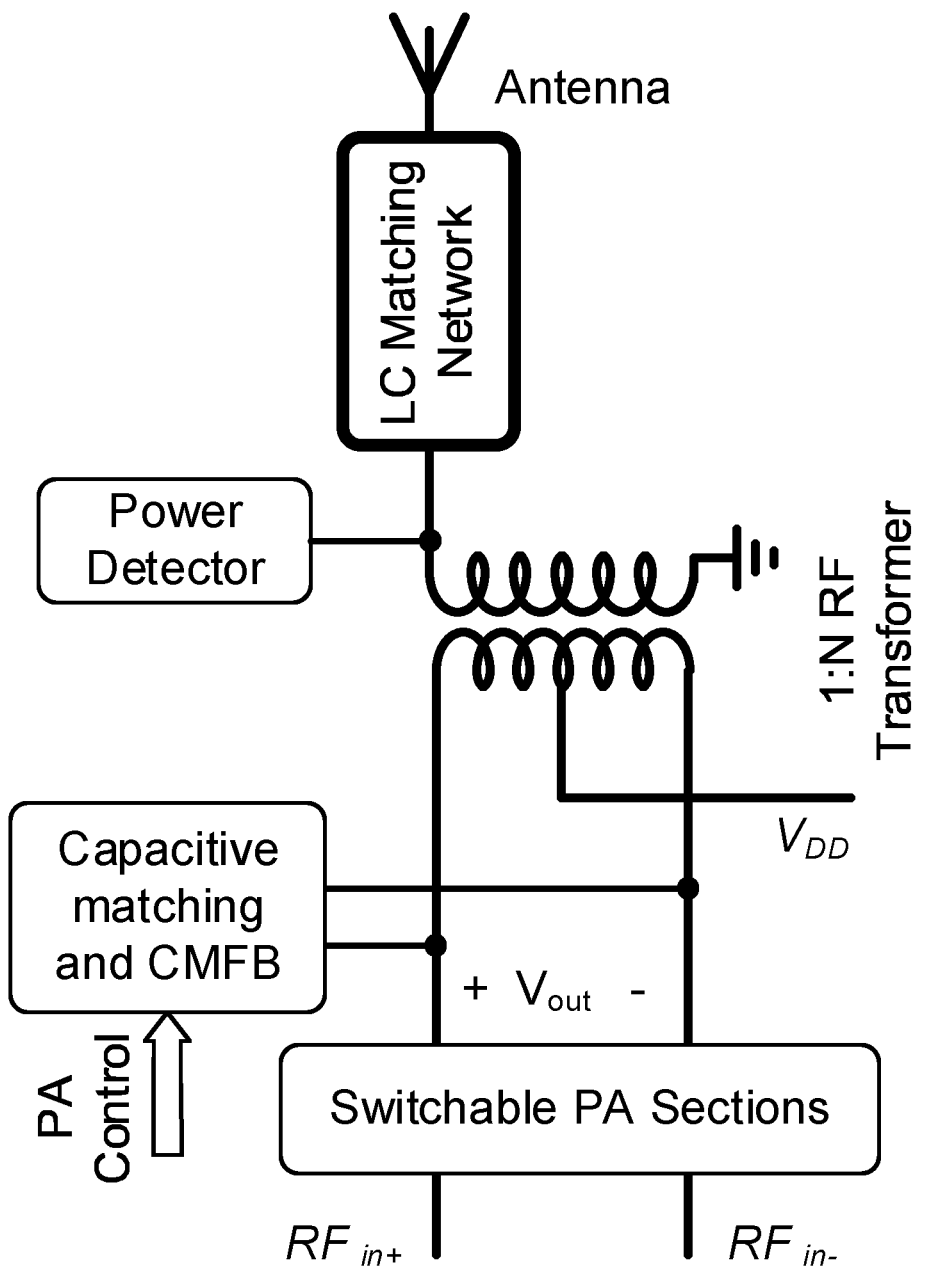
FIG. 9 shows a block diagram of a PA coupled to an antenna through a 1:N transformer. The PA coupled to the antenna includes a capacitive matching engine and power detection capabilities.

To maximize power transfer or minimize signal reflection, the impedance of the PA output should match that of the antenna. FIG. 9 shows a schematic of an impedance matching network 33 that terminates the PA. In this example, a 1:N transformer operates as an impedance converter because the antenna's impedance is reflected at the PA-chip output reduced by a factor of $N^2$. Using a transformer for impedance matching provides a remarkable advantage because CMOS technology supports limited voltage swing. Therefore, a 1:N transformer allows a reduction in the voltage $V_{out}$ while the voltage at the secondary of the transformer can be N-times higher. Thus, the expected signal swing (peak) at the drain of PA can be maintained within the limits imposed by the CMOS technology. For moderate output power, the transformer can be eliminated, because the output signal swing is small in these cases. While FIG. 9 illustrates an example using a transformer, other impedance matching implementations may also be used with embodiments of the invention.

Description of the Capacitive Matching

Because the number of active PA sections is correlated with signal power, the output capacitance at $V_{out}$ is not constant. Therefore, a capacitive matching network (shown as 39 in FIG. 3) may be used to maintain the capacitance at the PA output as constant as possible. Any suitable implementations for capacitive matching may be used. For example, embodiments of the invention may use a bank of compensating capacitors driven by a magnitude control signal that also controls the PA sections.

Figure 10:
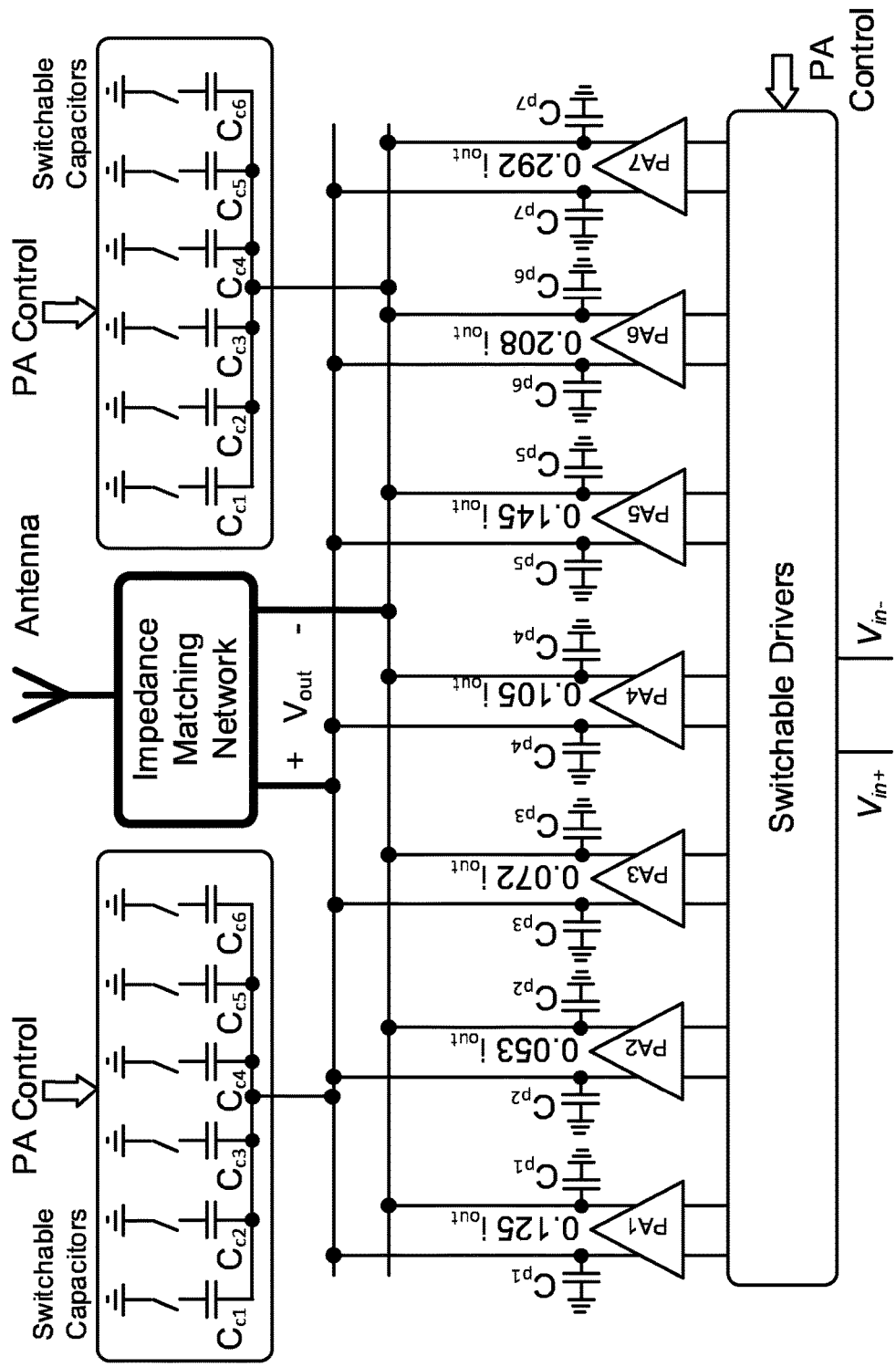
FIG. 10 shows a schematic of a transmitter front-end, in which a bank of strategic capacitors is driven by the PA control signals to maintain PA output capacitance as constant as possible for all operating modes.

FIG. 10 shows an example of a switchable capacitive matching network in accordance with one embodiment of the invention. The capacitive banks are driven by the PA control signals, which also control the ON-OFF operations of the PA sections. As shown in FIG. 10, weighted capacitive banks are allocated in parallel with the parasitic capacitors $C_{pi}$ present in PA output terminals. The parasitic capacitors may include drain capacitors as well as the capacitances added by the inductor and pads in case of off-chip inductors. The switchable capacitive matching network includes a set of compensating capacitors $C_{ci}$. The values of the compensating capacitors $C_{ci}$ are selected to compensate for capacitance variations due to the switching of the PA sections. The parasitic capacitors $C_{pi}$ for each PA control code are estimated beforehand. The aim is to maintain a substantially constant output node capacitance for all switching modes. As used herein, "substantially constant" means the variation is within an acceptable limit for the specification; such variation may be less than 10% of the peak value, preferably less than 5%, more preferably less than 3%, and most preferably less than 1%. An additional benefit of this architecture is that the PA switching and capacitive switching are synchronized because they are controlled from the same PA control signal.

Description of the Power Detector

Figure 11:
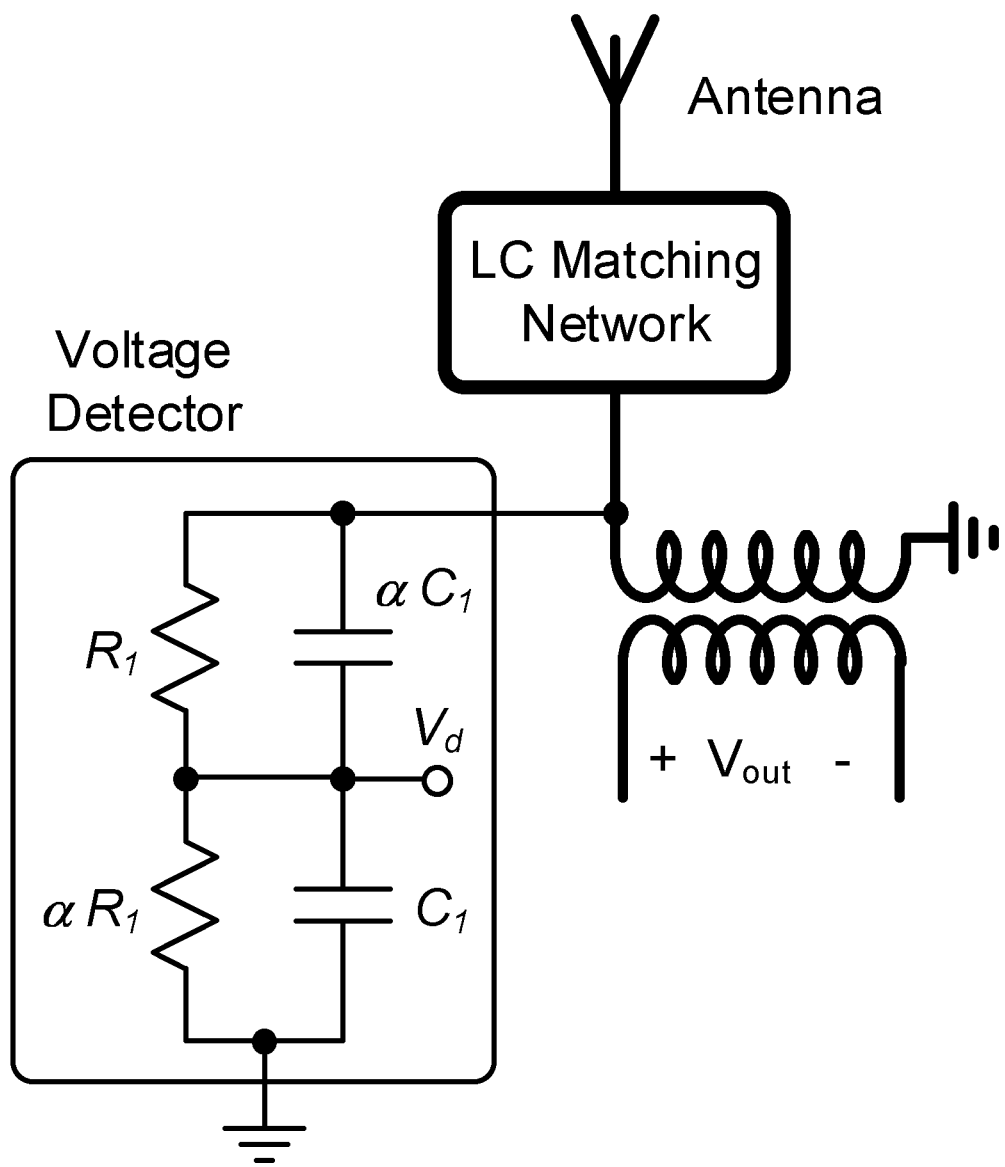
FIG. 11 shows an RC voltage divider, which is used to sample the voltage at the secondary of the transformer. Alternatively, a similar network (not shown in the schematic) can be used to sample the voltage at the input of the antenna.

Embodiments of the invention may use a power control mechanism to adjust the transmitter output power through an RF programmable gain amplifier (PGA, shown as 38 in FIG. 3). The power control mechanism uses a power detector (shown as 40 in FIG. 3) to sample the power levels at the output of the PA (or the power levels delivered to the RF antenna), and PGA 38 is adjusted based on the sampled power levels. For example, the output power can be estimated by measuring the voltage at the antenna using a power detector (e.g., an RF coupler). One embodiment of the invention uses a voltage divider as a tool to estimate the power delivered to the antenna, as shown in FIG. 11. This method is precise if the impedance of the antenna is accurately characterized and its value remains within the acceptable tolerance during mass production and under all operating conditions. In alternative embodiments of the invention, capacitive dividers may be used to estimate the power delivered to the antenna. However, the accuracy of the capacitive dividers may be limited by the parasitic capacitors. A resistive divider is more tolerant to parasitic capacitors provided that the parasitic pole generated due to the resistors is placed at very high frequencies.

FIG. 11 shows an example of a power detector circuit that may be used in embodiments of the invention. The bandwidth of this circuit may be significantly extended if the ratio of resistors is similar to the ratio of capacitors as shown in the figure. The ratio of resistors is precise, but the ratio of capacitors is sensitive to the parasitic capacitors. The resistors $R_1$ and $\alpha R_1$ are selected as large as possible to reduce its power consumption; the resistance is limited by the bandwidth While the embodiment in FIG. 11 has a power/voltage detector connected at the secondary of the transformer, one skilled in the art would appreciate that an alternative embodiment may have the voltage detector connected at any other node of the system.

Figure 12:
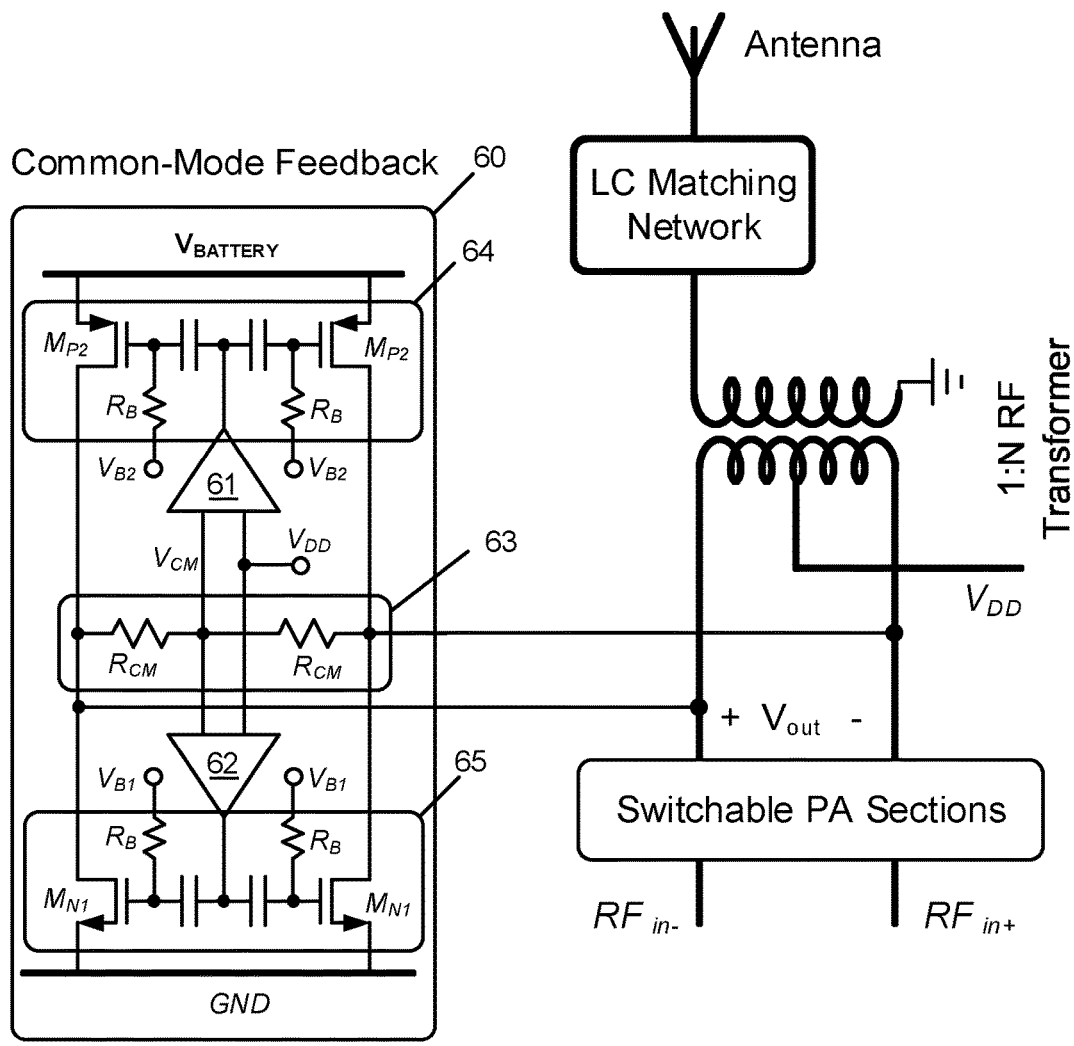
FIG. 12 shows a schematic of the common-mode feedback circuit connected at PA output to suppress common-mode glitches.

FIG. 12 shows an example of a common-mode feedback mechanism that may be used in embodiments of the invention. The manipulation of the PA segments may produce common-mode glitches that the primary of the antenna may not be able to handle properly. The common-mode glitches may be detected by a resistive common-mode detector (63 in FIG. 12). One skilled in the art would appreciate that this example is for illustration only and other variations and modifications are possible without departing from the scope of the invention; e.g. adding capacitors in parallel with resistors $R_{CM}$ in FIG. 12. The common-mode signal is then compared with a stable reference; $V_{DD}$ in this invention. The error signal is amplified by fast amplifiers (61 and 62 in FIG. 12) and the variations are coupled to transistors $M_{P2}$ and $M_{N1}$, respectively. The correcting currents are then generated to cancel the common-mode glitches. The CMFB (60 in FIG. 12) is only functional when common-mode glitches arise at PA output. Then, the bias voltages $V_{B1}$ and $V_{B2}$ are selected to set the operating point of the feedback transistors at the unset of their saturation region.

The above description uses limited number of examples to illustrate embodiments of the invention. One skilled in the art would appreciate that these examples are for illustration only and that other modifications and variations are possible without departing from the scope of the invention. Therefore, the scope of protection of the present invention should be limited by the enclosed claims.

What is claimed is:
1. A silicon-based transmitter, comprising:
 a reconfigurable linear power amplifier (PA) having a plurality of PA sections, wherein the plurality of PA sections comprises discrete transistor arrays that can be turned OFF or ON according to a magnitude of an input signal;
 a digital signal processor with an algorithm to process the input signal to obtain a control signal that drives the plurality of PA sections and maintains an overall transmitter power gain constant over an entire input signal range;
 a set of ON-OFF switchable drivers that control a power of the plurality of PA sections according to the control signal;
 an impedance matching network equipped with a bank of capacitors to reduce PA output impedance variations due to turning ON or OFF of the plurality of PA sections;
 a common-mode feedback (CMFB) mechanism configured to reduce common-mode variations and glitches at an output of the PA due to turning ON or OFF of the plurality of PA sections; and
 a capacitive matching engine comprising a set of compensating capacitors configured to maintain a substantially constant output node capacitance.

2. The silicon-based transmitter according to claim 1, wherein the control signal used to control the reconfigurable linear PA is generated from the input signal that is segmented and pre-processed in the digital signal processor.

3. The silicon-based transmitter according to claim 1, wherein the plurality of PA sections are controlled by a set of switchable PA drivers.

4. The silicon-based transmitter according to claim 1, wherein the CMFB mechanism comprises a power detector that samples a power level at the output of the PA, wherein the power level is used to adjust a transmitter output power through an RF programmable gain amplifier (PGA).

5. The silicon-based transmitter according to claim 1, further comprising a 1:N transformer disposed between the impedance matching network and the reconfigurable linear PA.

6. The silicon-based transmitter, wherein the silicon-based transmitter is a SiGe, CMOS, or BiCMOS transmitter.

7. A method for radio frequency transmission using the silicon-based transmitter of claim 1, comprising:
  processing an input signal, using the digital signal processor, to obtain the control signal;
  based on the control signal, regulating the set of ON-OFF switchable drivers to control the plurality of PA sections;
  adjusting the PA output impedance using the impedance matching network;
  maintaining the output node capacitance substantially constant using the capacitive matching engine; and
  reducing the common-mode glitches at the output of the PA using the common-mode feedback mechanism.

* * * * *